US012250491B2

(12) United States Patent
Biester et al.

(10) Patent No.: US 12,250,491 B2
(45) Date of Patent: Mar. 11, 2025

(54) METHOD FOR GENERATING A BIRD'S EYE VIEW IMAGE

(71) Applicant: dSPACE GmbH, Paderborn (DE)

(72) Inventors: Tobias Biester, Karlsruhe (DE); Boris Neubert, Karlsruhe (DE); Dennis Keck, Karlsruhe (DE)

(73) Assignee: DSPACE GMBH, Paderborn (DE)

( * ) Notice: Subject to any disclaimer, the term of this patent is extended or adjusted under 35 U.S.C. 154(b) by 109 days.

(21) Appl. No.: 18/063,776

(22) Filed: Dec. 9, 2022

(65) Prior Publication Data

US 2023/0199135 A1    Jun. 22, 2023

(30) Foreign Application Priority Data

Dec. 17, 2021  (DE) .......................... 102021133738.0
Dec. 17, 2021  (EP) ..................................... 21215590

(51) Int. Cl.
*G06T 3/00*      (2024.01)
*G06F 30/20*     (2020.01)
(Continued)

(52) U.S. Cl.
CPC ........... *H04N 5/2628* (2013.01); *G06F 30/20* (2020.01); *G06T 7/11* (2017.01); *G06T 7/35* (2017.01);
(Continued)

(58) Field of Classification Search
CPC ..... G06T 7/80; G06T 7/11; G06T 7/35; G06T 7/521; G06T 7/77; G06T 17/20;
(Continued)

(56) References Cited

U.S. PATENT DOCUMENTS

| 11,816,852 | B2* | 11/2023 | Lee ........................ G01S 17/931 |
| 2004/0105573 | A1 | 6/2004 | Neumann et al. |
| 2010/0207936 | A1* | 8/2010 | Minear ..................... G06T 7/30 345/419 |

(Continued)

FOREIGN PATENT DOCUMENTS

WO    WO 20180087348 A1    5/2018

OTHER PUBLICATIONS

Verma Rachna et al: "An Efficient Clustering Algorithm to Simultaneously Detect Multiple Planes in a Point Cloud", 2020 3rd International Conference on Emerging Technologies in Computer Engineering: Machine Learning and Internet of Things (ICETCE), IEEE, Feb. 7, 2020 (Feb. 7, 2020), pp. 154-159, XP033771732, DOI: 10.1109/ICETCE48199.2020.9091735 [retrieved on May 11, 2020] section II, figures 1,2,3.

(Continued)

*Primary Examiner* — Wesner Sajous
(74) *Attorney, Agent, or Firm* — LEYDIG, VOIT & MAYER, LTD.

(57) ABSTRACT

A computer-implemented method for generating a bird's eye view image of a scene includes: (a) acquiring at least one lidar frame comprising points with inherent distance information and at least one camera image of the scene; (b) generating a mesh representation of the scene by using the at least one lidar frame, the mesh representation representing surfaces shown in the scene with inherent distance information; (c) generating a mask image by classifying pixels of the at least one camera image as representing ground pixels or non-ground pixels of the at least one camera image; and (d) generating the bird's eye view image by enhanced inverse perspective mapping exploiting distance information inherent to the surfaces of the mesh representation, pixels of the mask image classified as ground pixels, and the at least one camera image.

15 Claims, 10 Drawing Sheets

(51) Int. Cl.

| | | |
|---|---|---|
| *G06T 7/11* | (2017.01) | |
| *G06T 7/35* | (2017.01) | |
| *G06T 7/80* | (2017.01) | |
| *G06T 17/20* | (2006.01) | |
| *G06V 10/764* | (2022.01) | |
| *G07C 5/06* | (2006.01) | |
| *H04N 5/262* | (2006.01) | |
| *H04N 23/69* | (2023.01) | |

(52) U.S. Cl.
CPC ............... *G06T 7/80* (2017.01); *G06T 17/20* (2013.01); *G06V 10/764* (2022.01); *G07C 5/06* (2013.01); *G06T 2207/10028* (2013.01); *G06T 2207/20221* (2013.01)

(58) Field of Classification Search
CPC ........... G06T 2207/10028; G06T 2207/20221; G06T 2207/20076; G06T 2207/20081; G06T 15/405; G06T 15/20; G06T 15/04; G06T 15/205; G06T 17/05; G06T 17/00; G06T 3/053; G06T 3/4038; G06T 3/04; H04N 5/2628; H04N 23/698; G06F 30/20; G07C 5/06; G06V 10/764; G06N 20/20; G05D 1/024; G05D 1/0212; G01S 17/931
See application file for complete search history.

(56) References Cited

U.S. PATENT DOCUMENTS

| | | | |
|---|---|---|---|
| 2015/0071534 A1* | 3/2015 | Riley | H04N 23/698 382/167 |
| 2016/0217611 A1* | 7/2016 | Pylvaenaeinen | G06T 15/405 |
| 2018/0082454 A1 | 3/2018 | Sahu et al. | |
| 2021/0334988 A1 | 10/2021 | Xiao et al. | |

OTHER PUBLICATIONS

Wang Ruisheng et al: "LiDAR Point Clouds 6 to 3-D Urban Models: A Review", IEEE Journal of Selected Topics in Applied Earth Observations and Remote Sensing, vol. 11, No. 2, Feb. 1, 2018 (Feb. 1, 2018), pp. 606-627, XP093004443, USA, ISSN: 1939-1404, DOI: 10.1109/JSTARS.2017.2781132, section II.B, p. 612, col. 1, p. 617, [9], p. 619, col. 1, figure 6.

Ohtake yet al: "Sparse surface 6 reconstruction with adaptive partition of unity and radial basis functions", Graphical Models, Elsevier, San Diego, CA, US, vol. 68, No. 1, Jan. 1, 2006 (Jan. 1, 2006), pp. 15-24, XP024941342, ISSN: 1524-0703, DOI: 10.1016/J.GMOD.2005.08.001 [retrieved on Jan. 1, 2006], section Background, Algorithm, figures 1,5.

Morel Jules et al: "Terrain Model Reconstruction from Terrestrial LiDAR Data Using Radial Basis Functions", IEEE Computer Graphics and Applications, vol. 37, No. 5, Sep. 1, 2017 (Sep. 1, 2017), Oct. 31, 2017 (Oct. 31, 2017), pp. 72-84, XP011660894, ISSN: 0272-1716, DOI: 10.1109/MCG.2017.3621225 [retrieved on Sep. 20, 2017] section 2, p. 15, line 1—p. 17.

\* cited by examiner

METHOD FOR GENERATING A BIRD'S EYE VIEW IMAGE

CROSS-REFERENCE TO PRIOR APPLICATIONS

This application claims benefit to European Patent Application No. EP 21215590.7 and German Patent Application No. DE 102021133738.0, filed on Dec. 17, 2021, each of which is hereby incorporated by reference herein.

FIELD

Within the scope of autonomous driving and/or driver assistance and relating testing and simulation technologies, the present invention relates to a computer-implemented method for generating a bird's eye view image of a scene by using lidar information and camera image information. The present invention further relates to a system and a computer program product configured to perform a method according to the invention and being used in a vehicle control system for autonomous driving and/or a driver assistance system and/or within environment for testing such systems.

BACKGROUND

Recently, autonomous driving and respective driving assistance has become relevant and a very popular area of research. To ensure the suitability for everyday use and the safety of systems for autonomous driving despite the ever-increasing complexity of technologies used, systems must be well tested before putting them into operation. Accordingly, it is reasonable to provide and utilize simulation scenarios, in which safety-critical driving scenarios can be tested with software and/or specific hardware reliably and in a cost efficient way.

In regard of both the simulated scenes for testing and the real-world traffic scenes, bird's eye view images are widely used in the process of generating enhanced models of the respective traffic scenes. A bird's eye view is an elevated view onto a scene from above, that is, from the perspective of an imaginary bird. Utilizing a bird's eye view perspective helps to operate a vehicle safer, since the more normalized top-down perspective is less error-prone in view of obtaining street information which is used for testing and/or operating autonomous driving systems, as compared to a regular front-view perspective camera image.

In effect, due to the more appropriate perspective vis-à-vis the scene in which a vehicle is operating (semi-) autonomously, be it a simulated or a real-world scene, bird's eye view images facilitate (testing of) autonomous driving and render it more precise and therefore more secure. However, known methods are inaccurate because they use simplistic models and/or only provide limited context information on the scene and the environment depicted, and/or are computationally too expensive.

Therefore, the need arises to efficiently transform regular camera images into bird's eye view images so that a precise and realistic top-down model of a scene is provided, including context information that can be used when the vehicle is navigated through the scene.

SUMMARY

In an exemplary embodiment, the present invention provides a computer-implemented method for generating a bird's eye view image of a scene. The method includes: (a) acquiring at least one lidar frame comprising points with inherent distance information and at least one camera image of the scene: (b) generating a mesh representation of the scene by using the at least one lidar frame, the mesh representation representing surfaces shown in the scene with inherent distance information: (c) generating a mask image by classifying pixels of the at least one camera image as representing ground pixels or non-ground pixels of the at least one camera image; and (d) generating the bird's eye view image by enhanced perspective mapping exploiting distance information inherent to the surfaces of the mesh representation, pixels of the mask image classified as ground pixels, and the at least one camera image.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
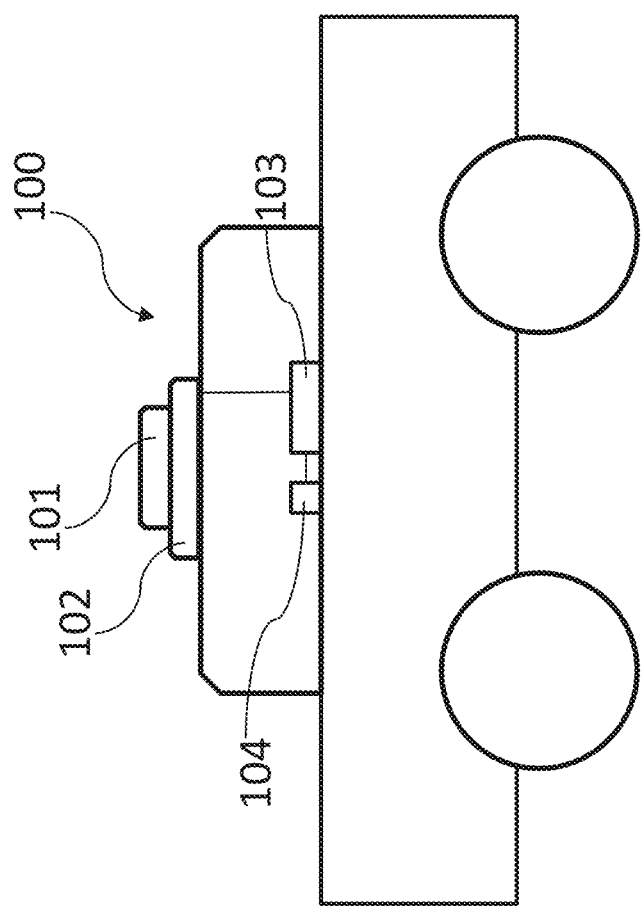
FIG. 1 shows a schematic structure of a system according to the present invention.

Exemplary embodiments of the present invention provide an effective and accurate method for generating a bird's eye view image on which the further processing in the context of autonomous driving/driver assistance and testing such systems can be reliably and securely based.

According to a first aspect of the present invention, there is provided a method for generating a bird's eye view image of a scene. The method comprises the following steps:

(a) acquiring at least one lidar frame comprising points with inherent distance information and at least one camera image of the scene;

(b) generating a mesh representation of the scene by using the at least one lidar frame, the mesh representation representing surfaces shown in the scene with inherent distance information;

(c) generating a mask image by classifying pixels of the at least one camera image as representing ground pixels or non-ground pixels of the at least one camera image; and (e) generating the bird's eye view image by enhanced inverse perspective mapping exploiting distance information inherent to surfaces of the mesh representation, pixels of the mask image classified as ground pixels, and the at least one camera image.

Specifically, the lidar frame is acquired by a lidar frame provision device, e.g. an appropriate lidar sensor, and reflects all objects of the scene, e.g. pedestrians, vehicles, trees, traffic signs and buildings, in a form of a point cloud comprising a plurality of points, each of which containing inherent distance information of the respective object.

The inherent distance information of the lidar frame's point cloud relates to the distance between the lidar frame provision device and the object in the scene, more particularly to a distinct surface element of that object being captured by a corresponding lidar frame. Knowing the position and orientation of the lidar frame provision device, coordinates of an object or parts or elements of an object in the scene can be calculated and the object or its elements are represented by points having inherent distance information. The lidar frame is generated by repeating this process. Correspondingly, the camera image is acquired by a camera image provision device, e.g. a high-resolution camera, and reflects the objects in the same scene as a 2D image projection.

After acquiring the lidar frame and the camera image, a mesh representation is generated. The mesh representation represents surfaces shown in the scene with inherent distance information. According to this process, the surfaces of the ground are distinguished and generated in the mesh representation according to the inherent distance information of the lidar points which refer to the respective surface.

Pixels of the camera image are classified into two groups to generate a mask image, wherein one group contains the pixels representing ground and the other group contains the pixels representing non-ground.

The bird's eye view image is generated by using enhanced inverse perspective mapping. The enhanced inverse perspective mapping exploits the distance information inherent to the surfaces of the mesh representation, the pixels which are classified as ground pixels in the mask image, and the camera image to provide a bird's eye view image. The ground pixels of that bird's eye view image are so-arranged in relation to each other, that any non-planar grounds of the captured scene are considered in a geometrically correct way. In that way, the present invention, firstly, bases the perspective mapping on a realistic model of the scene that considers non-planar ground and, secondly, provides a bird's eye view image that provides important context information in view of navigating a vehicle through the respective traffic scene.

Inverse Perspective Mapping (IPM) removes the perspective effects in an image taken by a vehicle's front-facing camera and remaps its pixels into a 2D domain based on which a top-down view is obtained. The enhanced IPM according to the present invention incorporates, inter alia, inherent distance information of the mesh representation and by that is based on a realistic 3D model of the scene that considers the scene's non-planar ground when mapping camera image pixels onto the bird's eye view image pixels. Additionally, the enhanced IPM according to the present invention uses, inter alia, the classification information as regards ground and non-ground pixels provided by the mask image so that, in the final bird's eye view image, context information of the scene is provided that is used to navigate the vehicle accurately and securely.

Consequently, a method according to the invention provides bird's eye view images that do not at all or at least contain only little distortions and inaccuracies resulting from a non-planar scene captured by the camera image. The solution thus provides bird's eye view images that particularly identify the ground pixels of the camera image with a high accuracy and from a realistic perspective. Particularly and realistically, the method does not depend on the assumption of planar ground, since the pixels classified as ground pixels in the mask image as well as the corresponding mesh representation with inherent distance information are used as a basis for calculating the bird's eye view image, thus providing reliable information on the true structure of the ground of the captured scene and, by that, a solid basis for any application within the context of pattern recognition, autonomous driving, and related issues.

According to a preferred embodiment of a computer-implemented method of the present invention, in step (c), the mask image is generated by projecting a segmented lidar frame onto the at least one camera image, thereby classifying pixels as representing ground pixels or non-ground pixels of the scene. Further, the segmented lidar frame is generated by classifying points of the at least one lidar frame as representing ground points or non-ground points of the scene by using the mesh representation.

Specifically, the points of the lidar frame are classified into two mutually exclusive groups of points, to thereby segment the lidar frame utilizing the mesh representation. According to the invention, one group contains the points representing ground and the other group contains the points representing non-ground.

The segmented lidar frame is then projected onto the camera image, through which a correspondence between the points in the segmented lidar frame and the pixels in the camera image is established. According to this correspondence, the pixels of the camera image are classified as ground pixels or non-ground pixels depending on the segmentation of corresponding points of the segmented lidar frame that are classified as either ground points or non-ground points.

According to another preferred embodiment of the invention, in step (c), the pixels of the at least one camera image are classified based on the classified points of the segmented lidar frame via a k-nearest neighbors algorithm, the k-nearest-neighbor algorithm preferably using k=3.

Based on an established correspondence, e.g. according to a k-d tree approach, between each pixel in the camera image and each point in the segmented lidar frame by projecting the segmented lidar frame onto the camera image, for a pixel in the camera image, the k nearest neighbor points in the segmented lidar frame are identified. If more than a predetermined number x<k of neighbor points in the segmented lidar frame are classified as non-ground, the respective pixel in the camera image is classified as non-ground pixel, otherwise it is classified as ground pixel. Preferably, within the present context of classifying pixels of the camera image, k=3 and x=0) is used. In this case, the k=3 nearest neighbor points of a pixel are identified in the segmented lidar frame. If any one of the k=3 nearest neighbor points is classified as non-ground, the respective pixel in the camera image is classified as non-ground as well.

According to a further preferred embodiment of a computer-implemented method of the present invention, in step (c), classifying the points using the mesh representation comprises calculating normal vectors and distances from points of the at least one lidar frame to the mesh representation. Further, a point in the at least one lidar frame is classified as a ground point if the calculated distance of the point is within a predetermined distance and the calculated normal vector of the point is upwardly directed.

There exists a correspondence between the points of the mesh representation and the points of the lidar frame since the mesh representation is generated based on the points of the lidar frame. According to that correspondence, the normal vectors of each point of the lidar frame and the distance between each point of the lidar frame and the mesh representation are calculated. If the calculated distance between the point of the lidar frame and the mesh representation is within a predetermined distance and the calculated normal vector of the point of the lidar frame is upwardly directed, the point of the lidar frame is classified as a ground point, i.e. a point representing the ground.

According to another preferred embodiment, in step (c), remaining unclassified points of the at least one lidar frame are classified in that a remaining point is considered a ground point, if a proportion of neighboring remaining points classified as ground points exceeds a predetermined threshold, or, if a distance between the remaining point and other points classified as ground points is below a predetermined distance. Further, still remaining unclassified points are classified as non-ground, if the nearest point classified as ground point exceeds a predetermined distance, or if there is a point classified as ground point located below it.

Specifically, the remaining points, i.e. the points of the lidar frame which are not classified as ground points according to the calculated distance and normal vector as described above, are classified according to the following criteria: If a proportion of neighboring points of a remaining point which are classified as ground points exceeds a predetermined threshold, or if a distance between the remaining point and other points which are classified as ground points is below a predetermined distance, the remaining point is classified as a ground point. The remaining point is classified as a non-ground point, if the nearest point of a remaining point exceeds a predetermined distance, wherein the nearest point is classified as a ground point, or if there is any point classified as a ground point which is located below the remaining point.

According to another preferred embodiment of a computer-implemented method of the present invention, in step (b), the mesh representation is calculated by clustering the points of the lidar frame into cells, based on normal vectors of the points and by calculating normal planes for the cells using principal component analysis. Further, a mathematical representation of surfaces shown in the scene is generated by fitting a radial basis function representation using the normal planes to then form the mesh representation of the normal planes.

Within this embodiment, normal vectors of the points of the lidar frame are estimated, based on which estimated normal vectors the points are clustered into cells. Preferably, prior to normal vectors estimation, noisy points are filtered out initially. In another attempt to reduce noise and increase accuracy, points having estimated normal vectors that do not direct upwardly are filtered out as well.

Thereafter, a normal plane is calculated for each of the cells via Principal Components Analysis (PCA). Preferably, cells are removed which do not fulfill some or all predetermined criteria such as directing upwardly, having a maximum elevation, being not too far away from neighbors or being non-planar by comparing eigenvalues.

Thereafter, a mathematical representation of the surfaces of each object shown in the scene is generated by fitting a radial basis function representation based on the calculated normal planes. Preferably, before generating this mathematical representation, one point of each cell is selected to represent the corresponding cell, e.g. based on the center of gravity of the cell or any other appropriate method.

The mesh representation of the normal planes is then formed by sampling the mathematical representation on grid points.

According to another preferred embodiment of the present invention, in step (d), the bird's eye view image is generated by, firstly, calculating real-world coordinates of the surfaces as represented by the mesh representation. Secondly, the real-world coordinates are projected into an image space to thereby generate the bird's eye view image. Finally, pixels of the bird's eye view image are colored by referring to the classified pixels in the mask image and the colors of the corresponding pixels in the at least one camera image.

The surfaces represented by the mesh representation originate from the lidar frame containing points with inherent distance information. Based on the inherent distance information, the real-world coordinates of the surfaces are calculated. Thereafter, the real-world coordinates are projected onto an image space, that is, the 3D coordinates are transformed onto the 2D pixels of an image that represents, or will become at a later stage, the bird's eye view image.

However, at this stage, the bird's eye view image is comprised of pixels without colors, since these pixels are directly transformed from real-world coordinates of the surfaces into the mesh representation. In order to provide colors to the pixels of the bird's eye view image, the classification of a pixel in the mask image which corresponds to the pixel of the bird's eye view image is first read out and the color of the pixel in the camera image which corresponds to the pixel in the mask image is then read out. If the pixel in the mask image is read out as "ground pixel", the color of the pixel in the camera image is written to the pixel of the bird's eye view image. This coloring process is repeated until all pixels in the bird's eye view image whose corresponding pixels in the mask image classified as ground pixels are written with a color of the corresponding pixels in the camera image.

According to this embodiment, pixels in the bird's eye view image whose corresponding pixels in the mask image are classified as non-ground pixels are not provided with any colors. By that, non-ground pixels are hidden in or filtered out of the bird's eye view image which, in turn, provides both exclusive information on the ground pixels and context information as regards ground and non-ground pixels. Based on such information and context in the bird's eye view image, the accuracy of modelling the ground of the 3D scene within which a vehicle is navigating is greatly improved, thus also improving any processing based on the so-improved bird's eye view image.

According to another preferred embodiment of the present invention, in step (e), a trajectory bird's eye view image is generated by merging bird's eye view images generated as described above, step (d), those bird's eye view images corresponding to camera images taken by the same camera.

An image provision device, e.g. a camera, is installed on a moving object, e.g. a reference vehicle or another traffic participant. As the vehicle moves, a plurality of images is captured by the camera. Meanwhile, a lidar frame provision device providing a plurality of lidar frames, each of which corresponding to each of the images captured by the camera, is also installed on the moving object or vehicle. A bird's eye view image is generated by using one of the camera images and its corresponding lidar frame. This process, step (d), is repeated with each camera image and the corresponding lidar frame, thereby generating a plurality of bird's eye view images. Thereafter, these bird's eye view images are merged, step (e), to generate a trajectory bird's eye view image, wherein the bird's eye view images correspond to camera images taken by the same camera.

According to a preferred embodiment of this process, in step (e) the bird's eye view images are merged in that the trajectory bird's eye view image is composed of those pixels of the bird's eye view images that have an estimated shortest projection distance to the camera among the corresponding pixels across available bird's eye view images.

An object in a scene may recur in the neighboring bird's eye view images. To avoid such recurring of the object in the trajectory bird's eye view image, the color and the distance to the camera are read out for each pixel of the bird's eye view images. Among the pixels referring to one pixel of the recurring object, the closest pixel is identified, i.e. the one pixel that has the estimated shortest projection distance to the camera. This pixel is then set as representing the pixel of the recurring object in the trajectory bird's eye view image.

According to a preferred embodiment of the present invention, a final bird eye view image is generated in a final step (f), by merging trajectory bird's eye view images generated previously, step (e). The previously generated trajectory bird eye view images correspond to camera images taken by different cameras.

Specifically, in step (e), a trajectory bird's eye view image is generated based on the camera images taken by a camera. In the case that more than one camera is used, e.g. a plurality of cameras being installed on the moving object or vehicle, a trajectory bird's eye view image is generated for each of the cameras, thereby generating a plurality of trajectory bird's eye view images. These trajectory bird's eye view images are merged to generate a final bird's eye view image.

According to a preferred embodiment of this process, in step (f), merging the trajectory bird's eye view images comprises aligning histograms of the trajectory bird's eye images to each other, preferably by equalizing mean and variance values of the histograms.

For each of the trajectory bird's eye images a color histogram is generated, thereby generating a plurality of color histograms. These color histograms are aligned to each other, thereby merging the trajectory bird's eye view images represented by the color histograms. Preferably, the alignment is realized by equalizing the mean and variance values of the color histograms.

According to another preferred embodiment of the present invention, in step (f), merging the trajectory bird's eye view images comprises calculating a projection error of 3D projection into 2D camera image, i.e. of the estimated shortest projection distance to the camera. This projection error represents a pixel value difference between corresponding pixels of different bird's eye view images corresponding to camera images taken by the same camera. Further, the final bird's eye view image is composed of those pixels of the trajectory bird's eye view images that have the smallest projection error among corresponding pixels across the trajectory bird's eye view images.

The pixel having the shortest projection distance to the camera is calculated according to the above mentioned process. In the same way, the pixel having the second shortest projection distance to the camera is calculated. A projection error is estimated by calculating the color difference between the pixel having the shortest projection distance and the pixel having the second shortest projection distance to the same camera. In the case that more than one camera is provided, a plurality of projection errors is calculated, each of which corresponding to one of the cameras. Among the projection errors, the projection error having the smallest value is determined. Accordingly, the camera corresponding to the determined projection error is determined. Finally, the pixel having the shortest distance in the determined camera is set as the pixel of the final bird's eye view image.

According to a second aspect of the present invention, there is provided a system configured to generate a bird's eye view image of a scene, wherein the system comprises a lidar frame provision device, a camera image provision device, and a processor.

The lidar frame provision device is configured to provide or obtain at least one lidar frame comprising points with inherent distance information and the camera image provision device is configured to provide or obtain at least one camera image of the scene. Both the lidar frame provision device and the camera image provision device may be interfaces of the system, via which the system obtains lidar frames and camera images. That is, a system according to the present invention may not necessarily include a lidar frame sensor nor a camera, and may only include infrastructure for obtaining such image data from external lidar sensors and/or cameras.

The processor of the system according to the present invention is configured to generate a mesh representation of the scene by using the at least one lidar frame. The mesh representation represents surfaces shown in the scene with inherent distance information. The processor is further configured to generate a mask image by classifying pixels of the at least one camera image as representing ground pixels or non-ground pixels of the at least one camera image. The processor is further configured to generate the bird's eye view image by enhanced inverse perspective mapping and thereby exploiting distance information inherent to surfaces of the mesh representation, pixels of the mask image classified as ground pixels, and the at least one camera image. Further to that, the processor is preferably configured to carry out a method according to the first aspect of the present invention as well as all single steps thereof.

Preferably, the system represents or comprises or provides a regular computer infrastructure within the framework of which the processing is implemented in hardware and/or in software. Preferably, the system therefore comprises a processor, an appropriate hierarchy of memories, appropriate interfaces to external entities, such as lidar sensors and/or cameras, and as well as interfaces for allowing an operator to configure or operate the system. Preferably, the functions and capabilities of the system are provided by or in a software-program residing in a memory of the system and being executed by a processor of the system.

The system according to the present invention or the processor of that system is preferably comprised in a test or simulation environment for testing autonomously driving vehicles or simulating traffic scenes and/or in a vehicle control system for autonomous driving and/or in a driver assistance system.

According to a third aspect of the present invention, there is provided a computer program product which comprises instructions which, when the program is executed on a computer, cause the computer to carry out a method according to the first aspect of the present invention. Preferably, the computer-program product according to the third aspect is arranged such that it is stored in a memory of the system according to the second aspect and is executable by a processor of that system so that a computer-implemented method according to the present invention is implemented or realized.

It will be appreciated that all the devices, elements, units and means described in the present application could be implemented in software or hardware elements or combination thereof. All steps which are performed by the various entities described in the present application as well as the described functionalities are intended to mean that the respective entity is adapted to or configured to perform the respective steps and functionalities.

Further aspects, features and advantages of the present invention will become apparent to those of ordinary skills in the art upon reviewing the following detailed description of preferred embodiments and variants of the present invention in conjunction with the accompanying figures.

Detailed explanations of the present invention are given below with reference to attached drawings that illustrate specific embodiment examples of the present invention. These embodiments are described in sufficient detail to enable those skilled in the art to practice the invention. It is to be understood that the various embodiments of the present invention, although different, are not necessarily mutually exclusive. For example, a particular feature, structure, or characteristic described herein in connection with one embodiment may be implemented within other embodiments without departing from the scope of the present invention. In addition, it is to be understood that the position or arrangement of individual elements within each disclosed embodiment may be modified without departing from the scope of the present invention. It also is to be understood that the order of individual steps and sub-steps within a method according to the invention may be altered or modified or sub-steps may be omitted entirely without departing from the scope of the present invention.

The following detailed description is, therefore, not to be taken in a limiting sense, and the scope of the present invention is defined only by the appended claims, appropriately interpreted, along with the full range of equivalents to which the claims are entitled. In the drawings, alike numerals refer to the same or similar functionality throughout the several views.

Throughout this specification, the term "ground" is understood as the solid surface of the earth, pavement or street surface on which a vehicle or other traffic participants are moving. The ground does not have to be entirely planar but may comprise height gradients or slopes within the usual limits. The term "bird's eye view" is understood as an elevated, top-down view of an object from a perspective of a bird looking down on a scene.

FIG. 1 shows a schematic structure of a system 100 according to the present invention. The system 100 comprises a lidar frame provision device 101, such as one or more lidar sensors, a camera image provision device 102, such as one or more cameras, as well as a processor 103, storage 104 and further known infrastructure.

The lidar frame provision device 101, which may be a lidar sensor or an interface via which the system 100 obtains lidar frames, is preferably installed on top of or at some other suitable place of a moving object, for example a vehicle or the like, to obtain or acquire at least one lidar frame of at least one scene comprising different objects, like buildings, pedestrians, other vehicles, further traffic participants, traffic signs and signals, or the like. The acquired at least one lidar frame is transmitted from the lidar frame provision device 101 to the processor 103 through LAN or CAN or any other appropriate data communication network.

The camera image provision device 102, which may be a camera or an interface via which the system 100 obtains camera images, which is installed on top of or at some other suitable place of a moving object or vehicle to obtain or acquire at least one camera image of the at least one scene that is captured by the lidar frame. The acquired at least one camera image is transmitted from the camera image provision device 102 to the processor 103 through LAN or CAN or any other appropriate data communication network.

The processor 103 may be a central processing unit (CPU) receiving the at least one lidar frame and the at least one camera image and processing the received image data to generate at least one bird's eye view image. Preferably, the processing is performed in accordance with the provisions and commands of a computer program stored in the storage 104 connected to the processor 103. Based on the generated bird's eye view image, the processor 103 gives instructions to the control system of the vehicle to assist or conduct a self-driving process. Alternatively, the generated bird's eye view image is sent from the processor 103 to the storage 104 and stored therein for a simulation of the scenes at a later stage within the framework of testing self-driving systems.

The storage 104 may be a hard disk or a cloud, but is not limited thereto, in which either the program realizing the processor 103 or the generated bird's eye view image or both are stored in such a way that the processor 103 can access and execute the computer program.

Figure 2:
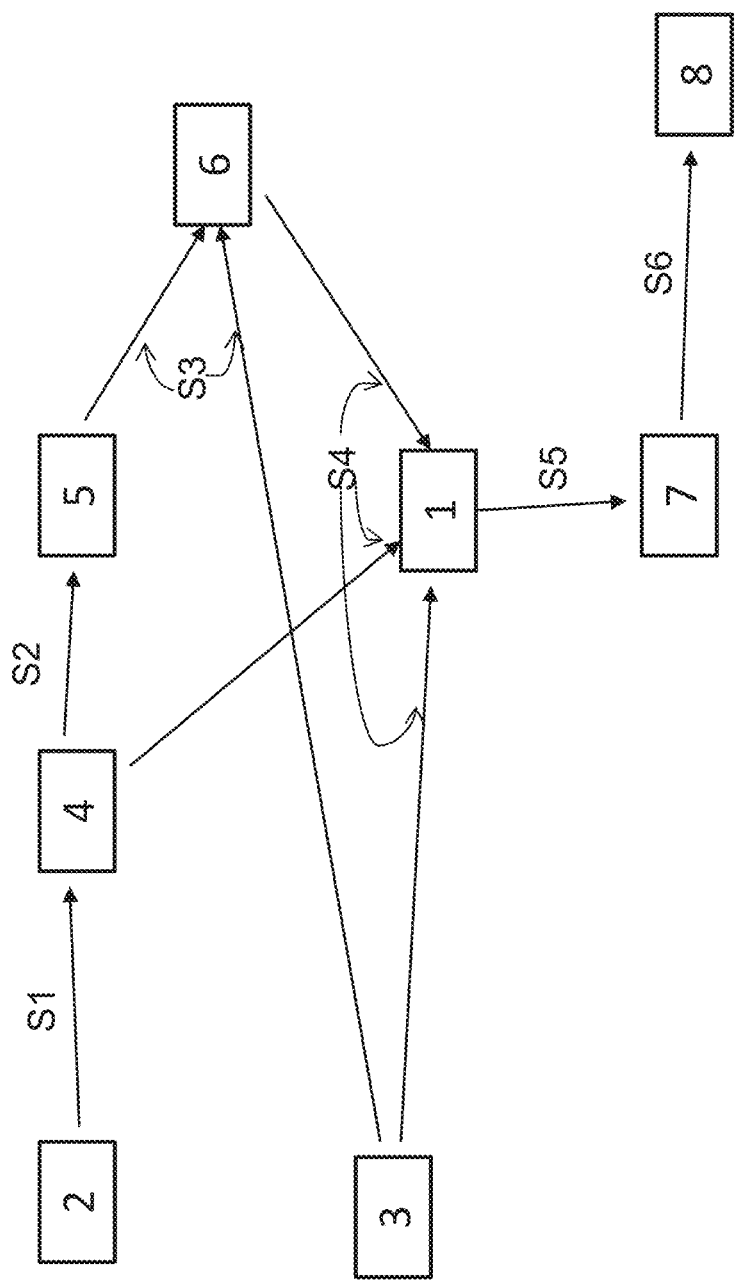
FIG. 2 shows a schematic structural diagram of generated data and the steps of generating the data.

FIG. 2 shows a schematic structural diagram of a preferred embodiment of the present invention comprising various stages 1 to 8 of processed data as well as the respective processing steps S1 to S6. The data processed and generated throughout the process of FIG. 2 comprises a lidar frame 2, a camera image 3, a mesh representation 4 (see FIG. 3a), a segmented lidar frame 5 (see FIG. 3b), a mask image 6 (see FIG. 3c), a bird's eye view image 1 (see FIG. 3d), a trajectory bird's eye view image 7 (see FIGS. 3e (a)-(b)), and a final bird's eye view image 8 (see FIG. 3f).

As illustrated, the mesh representation 4 is generated based on the lidar frame 2 in the sense that the lidar frame 2 serves as an input to processing step S1. In the same sense, the segmented lidar frame 5 is generated based on the mesh representation 4. The mask image 6 is generated based on the segmented lidar frame 5 and the camera image 3. The bird's eye view image 1 is generated based on the camera image 3, the mesh representation 4 and the mask image 6. The trajectory bird's eye view image 7 is generated based on more than one bird's eye view image 1, wherein the bird's eye view images are generated based on the camera images taken from the same camera. The final bird's eye view image 8 is generated based on more than one trajectory bird's eye image 7, wherein each of the trajectory bird's eye view images 7 is generated based on camera images taken by a different camera.

At least one lidar frame 2 of a scene comprising points with inherent distance information is acquired by a lidar frame device, e.g, by one or more lidar sensors. The points reflect the distance information between the lidar frame device and the detected objects in the scene. At least one camera image 3 is acquired by a camera device, e.g. one or more cameras, of the same scene. The objects of the scene are reflected on the at least one camera image 3. Instead of using actual lidar sensors and cameras, provision devices can be used that provide or obtain lidar frames 2 and camera images 3 acquired elsewhere and/or by unknown manners of acquisition.

According to step S1, the mesh representation 4 is generated representing surfaces shown in the scene with inherent distance information. According to this process, the surfaces of the ground are generated in the mesh representation 4 according to the inherent distance information of the lidar points in the lidar frame 2 which refer to the respective surface.

According to step S2, the segmented lidar frame 5 is generated by classifying the points of the lidar frame 2 into two groups of points by using the mesh representation 4. One group contains the points representing ground points of the lidar frame and the other group contains the points representing non-ground points of the lidar frame.

According to step S3, the mask image 6 is generated by classifying pixels of the camera image 3 into two groups according to the segmented lidar frame 5 containing points classified as ground and non-ground. After being classified, the mask image 6 contains pixels representing ground pixels and pixels representing non-ground pixels.

According to step S4, the bird's eye view image 1 is generated by an enhanced inverse perspective mapping according to the present invention, the method being different from conventional inverse perspective mapping. Enhanced inverse perspective mapping exploits the distance information inherent to the surfaces of the mesh representation 4, the pixels classified as ground pixels in the mask image 6, and the camera image 3. Based on this input a bird's eye view image 1 is generated whose top-down perspective is more realistic and more accurate than images generated by conventional inverse perspective mapping, because a non-planar ground of the captured scene is considered and non ground objects are masked out.

According to step S5, an image provision device, e.g. a camera, a camera image source, or an interface via which camera images are obtained, is installed on or in the moving object, e.g. a vehicle. When the vehicle moves, a plurality of camera images 3 are captured by the camera. Meanwhile, a lidar frame provision device is also installed on the moving object, which provides a plurality of lidar frames 2 each of which corresponding to each of the camera images 3 taken by the camera. According to step S4, the bird's eye view image is generated by using one of the camera images 3 and its corresponding lidar frame 2. The step S4 is repeated by using each one of the camera images 3 and its corresponding lidar frame 2, thereby generating a plurality of bird's eye view images 1. Thereafter, these bird's eye view images 4 are emerged to generate a trajectory bird's eye view image 7.

According to step S6, more than one camera or camera image sources are used, e.g. a plurality of cameras being installed on a moving object. A trajectory bird's eye view image 7 is generated according to step S5 for each of the cameras respectively, thereby generating a plurality of trajectory bird's eye view images 7. These trajectory bird's eye view images 7 are merged to generate a final bird's eye view image 8.

Figure 3A:
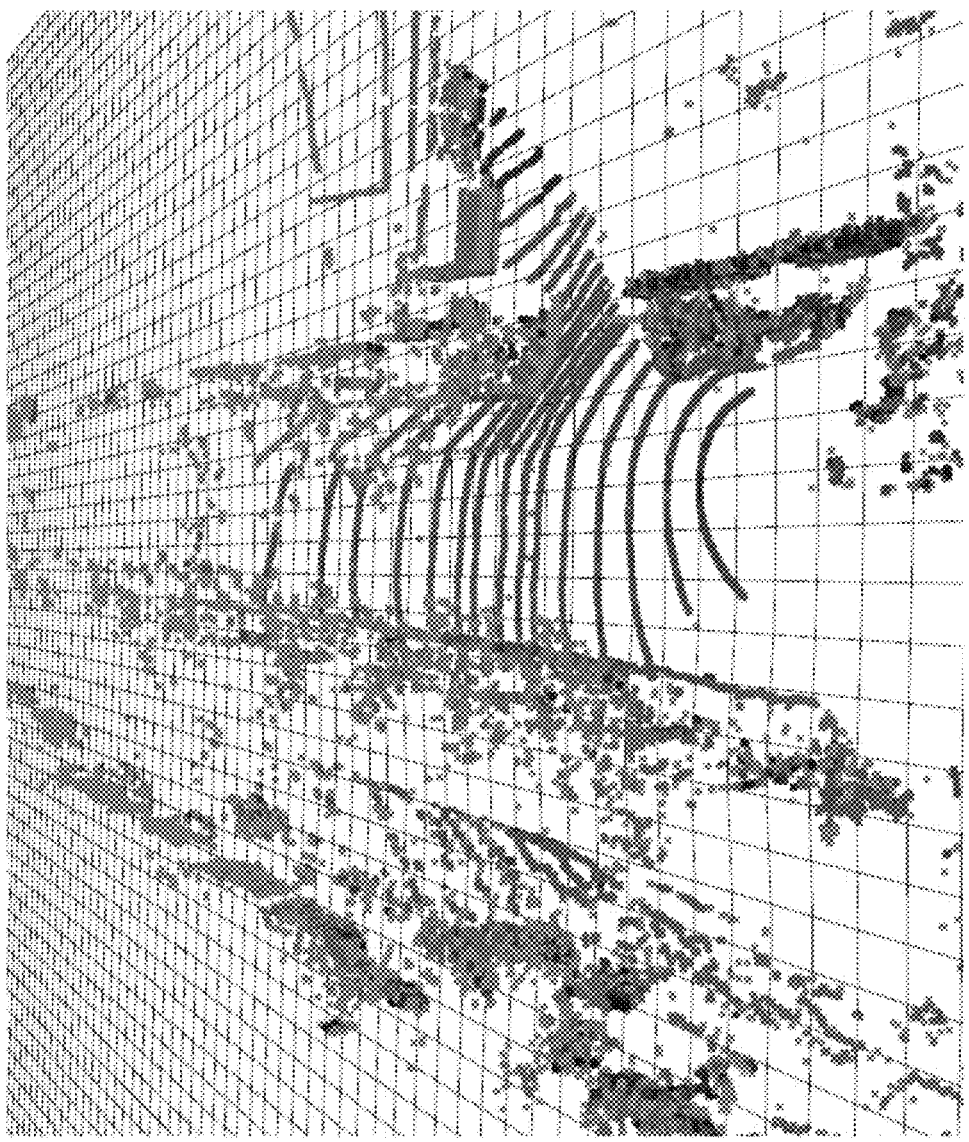
FIG. 3a shows a mesh representation generated in step S1.

FIG. 3a shows the mesh representation 4 generated in step S1. Step S1 comprises some or all of the following sub-steps to generate the mesh representation 4:

In a first sub-step of S1, noise of the points in the lidar frame 2 is filtered out. In a second sub-step of S1, normal vectors of the points in the lidar frame 2 are estimated. In a third sub-step of S1, points are filtered out whose estimated normal vectors do not direct upwards. In a fourth sub-step of S1, the points in the lidar frame 2 are clustered into cells. In a fifth sub-step of S1, a normal plane is calculated for each of the cells by using principal component analysis (PCA) or another appropriate mathematical method. In a sixth sub-step of S1, those cells are removed which do not fulfill the predetermined constraints. e.g. directing upwards, having a maximum elevation, and being not too far away from neighbors. In a seventh sub-step of S1, one point is selected for each of the cells to represent the corresponding cell. In an eighth sub-step of S1, a mathematical representation of the surfaces of each object shown in the scene is generated by fitting a radial basis function representation, in which process the calculated normal planes are used as a basis. In a ninth sub-step of S1, the mesh representation 4 of the normal planes is formed by sampling the mathematical representation on grid points.

Figure 3B:
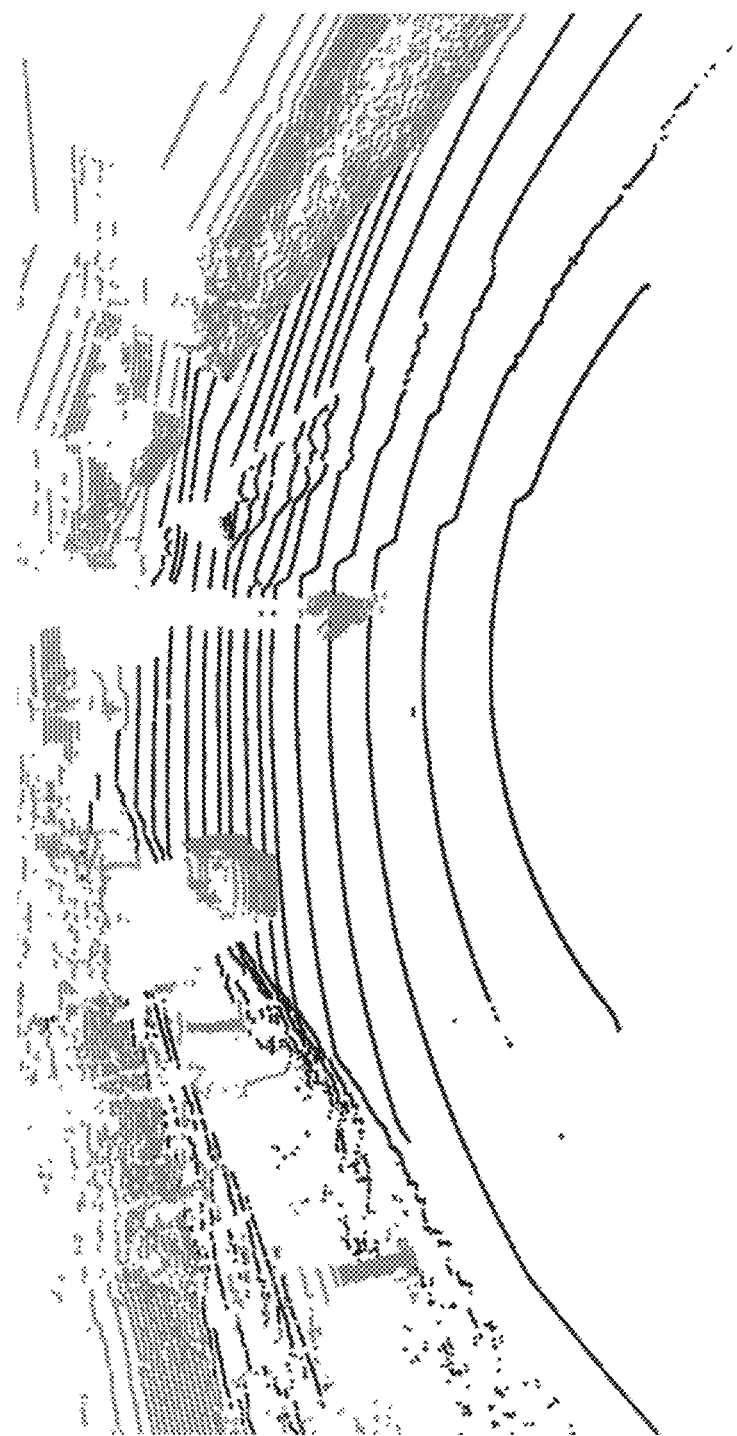
FIG. 3b shows a segmented lidar frame generated in step S2.

FIG. 3b shows the segmented lidar frame 5 generated in step S2. The step S2 comprises some or all of the following sub-steps:

There exists a correspondence between the points of the mesh representation 4 and the points of the lidar frame 2, since the mesh representation 4 is generated based on the points of the lidar frame 2 in step S1. According to the correspondence, in a first sub-step of S2, the normal vectors of each point of the lidar frame 2 and the distance between each point of the lidar frame 2 and its corresponding point of the mesh representation 4 are calculated.

In a second sub-step of S2, if the calculated distance between the point of the lidar frame 2 and its corresponding point in the mesh representation 4 is within a predetermined distance and the calculated normal vector of the point of the lidar frame 2 is upwardly directed, the point of the lidar frame 2 is classified as a ground point, i.e. a point representing the ground.

In a third sub-step of S2, the remaining points, i.e. the points of the lidar frame 2 which were not classified as ground points in the second sub-step of S2, are classified according to the following criteria: If a proportion of ground-classified neighboring points of a remaining point exceeds a predetermined threshold, or if a distance between the remaining point and any other ground-classified point is below a predetermined distance, the remaining point is classified as a ground point. The remaining point is classified as a non-ground point if the nearest ground-classified point of a remaining point exceeds a predetermined distance, or if there is any point classified as a ground point which is located beneath the remaining point.

Figure 3C:
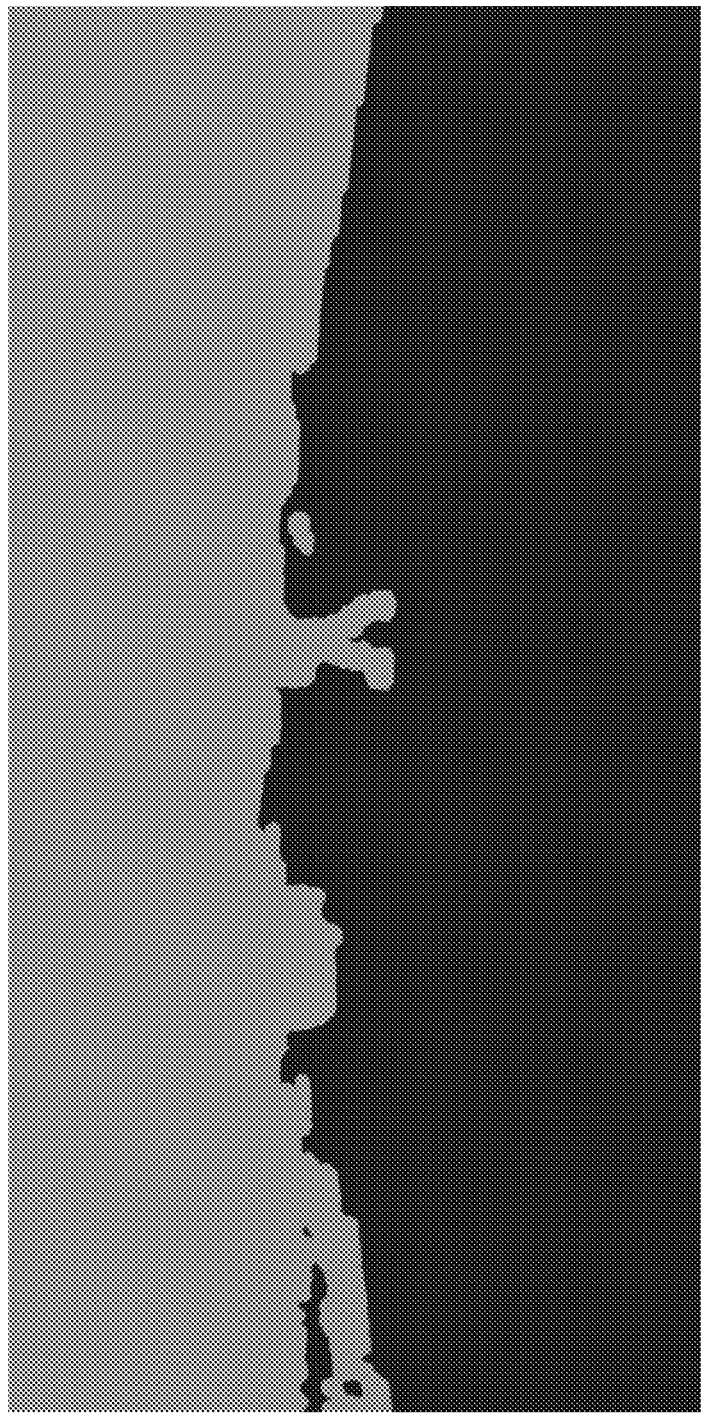
FIG. 3c shows a mask image generated in step S3.

FIG. 3c shows a mask image 6 generated in step S3. The step S3 comprises some or all of the following sub-steps to generate the mask image 6:

In a first sub-step of S3, the segmented lidar frame 5 is projected onto the camera image 3, through which a correspondence between the points in the segmented lidar frame 5 and the pixels in the camera image 3 is established.

In a second sub-step of S3, according to the established correspondence, the k nearest neighbor points of the pixel in the segmented lidar frame are identified for a pixel in the camera image 3. If more than a predetermined number x of neighbor points in the segmented lidar frame are classified as non-ground points, the pixel in the camera image is accordingly classified as non-ground pixel. Otherwise, the pixel is classified as a ground pixel, wherein x is less than k. In the case that k is set to 3 and x is set to 0, three nearest neighbor points of a pixel are searched in the segmented lidar frame 5. If all three nearest neighbor points in the segmented lidar frame 5 are classified as ground, the pixel in the camera image 3 is classified as ground as well. If any one of the 3 nearest neighbor points in the segmented lidar frame 5 is classified as non-ground, the pixel in the camera image 3 is classified as non-ground.

Figure 3D:
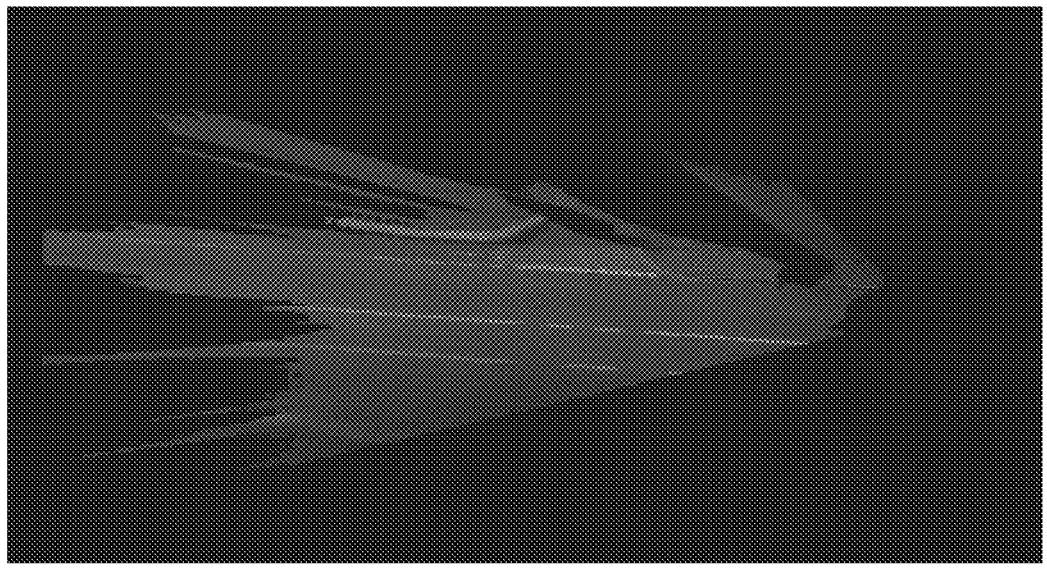
FIG. 3d shows a bird's eye view image generated in step S4.

FIG. 3*d* shows the bird's eye view image 1 generated in step S4. The step S4 comprises some or all of the following sub-steps:

The surfaces represented by the mesh representation 4 are generated based on the lidar frame 2 containing points with inherent distance information in step S1. In a first sub-step of S4, based on the inherent distance information of the surfaces, the real-world coordinates of the surfaces are calculated.

In a second sub-step of S4, the calculated real-world coordinates are projected onto an image space, i.e. transforming from 3D coordinates into 2D pixels of an image, wherein the newly generated image represents, or will gradually become, the bird's eye view image 1. However, the bird's eye view image at this stage is comprised of pixels without colors, since these pixels are directly transformed from real-world coordinates of the surfaces in the mesh representation. In order to color a pixel of the bird's eye view image, some or all of the following sub-steps are performed:

In a third sub-step of S4, the classification of the pixel in the mask image 6 is read, wherein the pixel in the mask image 6 corresponds to the pixel of the newly generated bird's eye view image 1.

In a fourth sub-step of S4, the color of the pixel in the camera image 3 is read, wherein the pixel in the camera image 3 corresponds to the same pixel in the mask image 6 whose classification is read in the third sub-step of S4.

In a fifth sub-step of S4, if the classification of the pixel in the mask image 6 is read out as "ground" in the third sub-step of S4, the color of the pixel in the camera image 3 read out in the fourth sub-step of S4 is written to the pixel of the bird's eye view image 1.

In a sixth sub-step of S4, the process of the third to fifth sub-steps of S4 is repeated until all pixels in the bird's eye view image 1 whose corresponding pixels in the mask image 6 classified as ground pixels are written with a color of the corresponding pixel in the camera image 3.

Figure 3F:
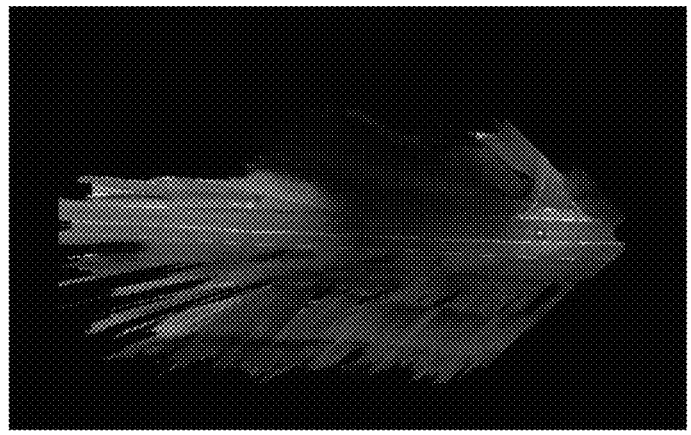
FIG. 3f shows a final bird's eye view image generated in step S6.
Figure 3E:
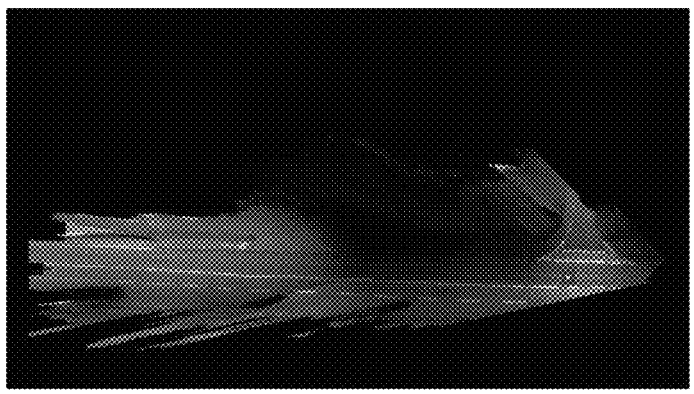
FIGS. 3e(a) and 3e(b) show two trajectory bird's eye view images as generated in step S5.
Figure 3E:
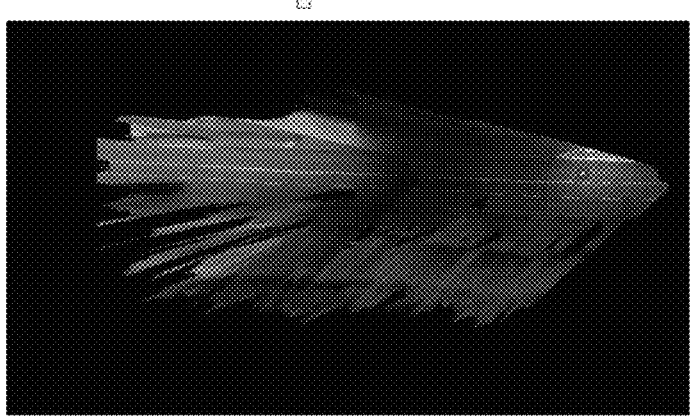

Each of FIGS. 3*e* (a) and 3*e* (b) shows a trajectory bird's eye view images 7 captured by two different cameras, as generated in step S5. The step S5 comprises some or all of the following sub-steps:

A plurality of bird's eye view images 1 is generated by repeating step S4 as described above, wherein all the bird's eye view images 1 correspond to camera images 3 taken by the same camera. Street markings recur in some of the bird's eye view images, e.g. in neighboring bird's eye view images. Recurring street markings need to be merged, i.e. the corresponding pixels of each of the recurred street markings being merged or selected, such that the recurred street markings only appear once in the generated trajectory bird's eye view image 7.

In a first sub-step of S5, the color of each pixel in all bird's eye view images 1 is read out, wherein the color of each pixel is generated in the sixth sub-step of S4 as described above.

In a second sub-step of S5, the distance between each pixel in all the bird's eye view images and the camera is read out, wherein real-world coordinates containing distance information are generated in the first sub-step of S4 as described above.

In a third sub-step of S5, pixels in different bird's eye view images 1, which refer to one pixel of the one or more recurring objects, are clustered into different groups. That is, each clustered group contains only the pixels referring to one pixel of the recurring objects.

In a fourth sub-step of S5, among each group, it is determined which pixel is closest, i.e. having an estimated shortest projection distance which is read in the second sub-step of S5, to the camera.

In a fifth sub-step of S5, the selected pixel in the fourth sub-step of S5 is set as the pixel of the recurring objects in the trajectory bird's eye view image 7 and the color of the selected pixel is assigned to the corresponding pixel in the trajectory bird's eye view image 7. In case that the pixels in the bird's eye view images refer to an object which appears in only one bird's eye view image, these pixels are set directly as pixels of the trajectory bird's eye view image and the color of these pixels are assigned to the corresponding pixels in the trajectory bird's eye view image.

In a sixth sub-step of S5, the fifth sub-step of S5 is repeated until all the pixels in the trajectory bird's eye view images 7 are assigned with a color, or discarded if the pixels are invisible in the camera images or masked out.

FIG. 3*f* shows the final bird's eye view image 8 generated in step S6. The step S6 comprises some or all of the following sub-steps:

When a plurality of cameras are provided, a plurality of trajectory bird's eye view images 7 are generated according to step S5, each of which corresponding to a different camera. One object may recur in different trajectory bird's eye view images 7, e.g, between two neighboring bird's eye view images 7. The corresponding pixels of the recurring object in different trajectory bird's eye view images 7 need to be merged or selected, such that the recurring object appears only once in the final bird's eye view image 8.

In a first sub-step of S6, a color histogram is generated for each of the trajectory bird's eye view images 7, thereby generating a plurality of color histograms.

In a second sub-step of S6, the histograms generated in the first sub-step of S6 are aligned to each other in the way of equalizing the mean and variance values of the color histograms.

In a third sub-step of S6, in accordance with the fourth sub-step of S5 as described above, the pixel second closest, i.e. having the second shortest projection distance to the camera, is selected from the clustered groups generated in the third sub-step of S5. The method of identifying the second closest pixel in the third sub-step of S6 is in principle comparable to the method of identifying the closest pixel in the fourth sub-step of S5 as described above.

In a fourth sub-step of S6, a projection error is estimated by estimating the color difference between the pixel having the shortest projection distance generated in the fourth sub-step of S5 and the pixel having the second shortest projection distance generated in the third sub-step of S6, wherein these two pixels are clustered into one group in the third sub-step of S5 as described above.

In a fifth sub-step of S6, for each of the pixels in the trajectory bird's eye view images 7, a projection error is estimated according to the fourth sub-step of S6 as described above, thereby generating a plurality of projection errors.

In a sixth sub-step of S6, the projection errors are clustered into different groups dependent on whether the corresponding projection errors refer to the same pixel of the recurring object. For example, a first projection error is generated based on a first pixel in a first trajectory bird's eye view image from a first camera and a second projection error is generated based on a second pixel in a second trajectory bird's eye view image from a second camera. If the first pixel and the second pixel refer to the same object pixel, e.g. of a building, which recurs in both the first and second trajectory bird's eye view images, the first and the second projection error are clustered into one group.

In a seventh sub-step of S6, among the projection errors in one group, the smallest projection error, i.e. the projection error having the smallest value, is selected.

In an eighth sub-step of S6, the pixel in the trajectory bird's eye view image corresponding to the projection error selected in the seventh sub-step of S6 is set as the pixel of the final bird's eye view image 8. As for the pixels in the trajectory bird's eye view images which do not refer to a recurring object, i.e. the pixels referring to an object appearing in only one trajectory bird's eye view image, those pixels are directly set as pixels of the final bird's eye view image 8.

In a ninth sub-step of S6, the seventh and eighth sub-steps of S6 are repeated until the final bird's eye view image 8 is generated.

Additionally, the arrangement of FIGS. 3e (a), 3e (b), and FIG. 3f as an equation provides an additional illustration of the process describes above in connection with step S6, according to which a plurality of trajectory bird's eye view images 7 generated according to step S5, for example the two trajectory bird's eye view images 7 shown in FIGS. 3e (a) and 3e (b), are combined or merged (symbolized by "+" between FIGS. 3e (a) and 3e (b)) into a final bird eye's view image 8 (symbolized by "=" between FIGS. 3e (b) and 3f). Accordingly, objects recurring in more than one trajectory bird-eye view image 7 are merged or combined such that they appear only once in the final bird-eye view image 8.

Figure 4A:
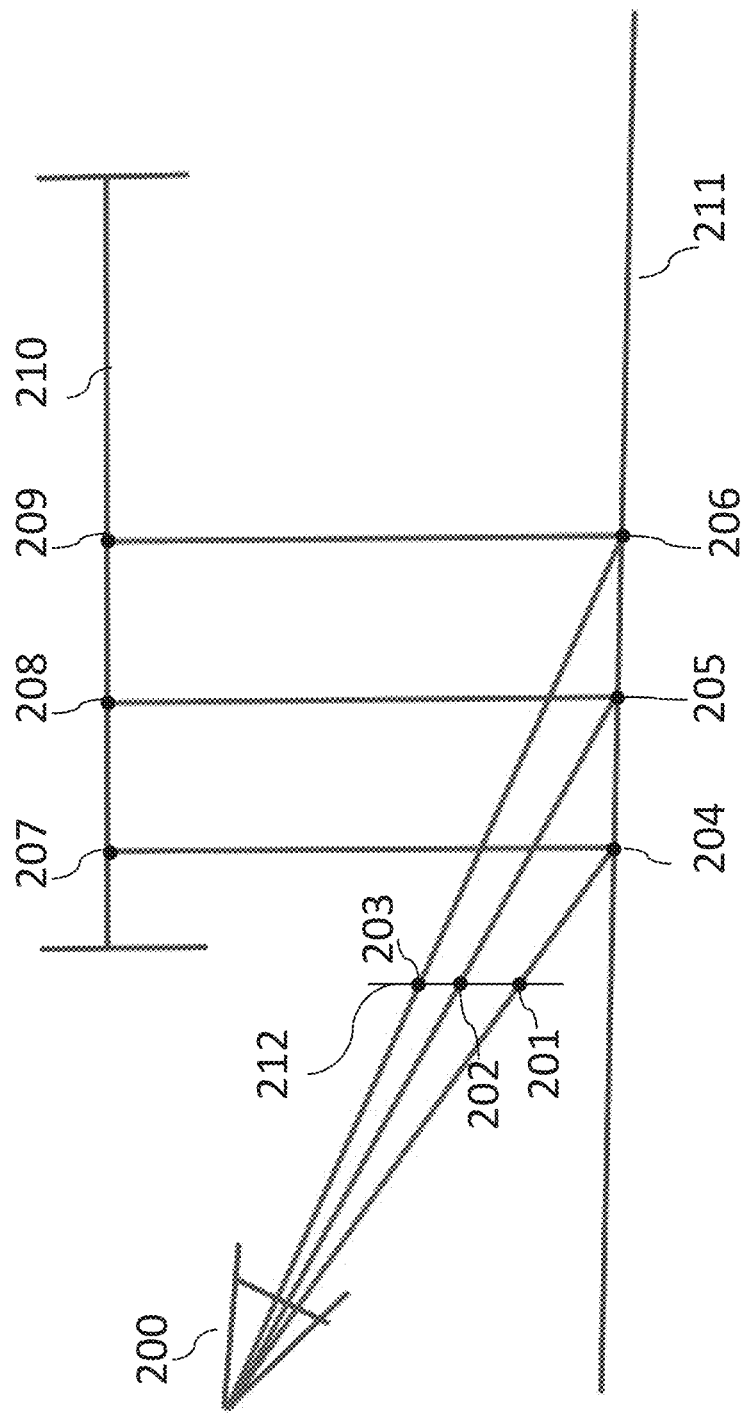
FIG. 4a illustrates a process of inverse perspective mapping (IPM) according to the prior art.

FIG. 4a illustrates a process of inverse perspective mapping (IPM), where the ground 211 is assumed planar, i.e. without any height differences, slopes or the like. The three points 204, 205 and 206 on the ground 211 are projected onto a camera image 212 as image points 201, 202 and 203, respectively. It is noted that the distance between exemplary points 204, 205 and 206 is equal on the ground 211. However, when these three equally distanced ground points are projected onto image 212, the distance between points 201, 202 and 203 vary depending on the distance of respectively corresponding ground points 204, 205, 206 from the image plane.

On the bird's eye view image 210, the three points 204, 205 and 206 are projected onto equally distanced points 207, 208 and 209, respectively. The IPM ideally transforms the image 212 onto the bird's eye view image 210 so that points 201, 202, 203 are mapped onto points 207, 208, 209, thereby normalizing distances so that points 207, 208, 209 of the bird's eye view image 210 are equally distanced, like corresponding ground points 204, 205, 206. This process, however, only works reasonably well if the ground is or can be assumed to be planar, as in FIG. 4a. In other words, equally spaced points 207, 208, 209 of the bird's eye view image 210 intersect with ground pixels 204, 205, 206, respectively, and respective color values of points 207, 208, 209 are read out from points 203, 202, 201 of the image 212, respectively.

Figure 4B:
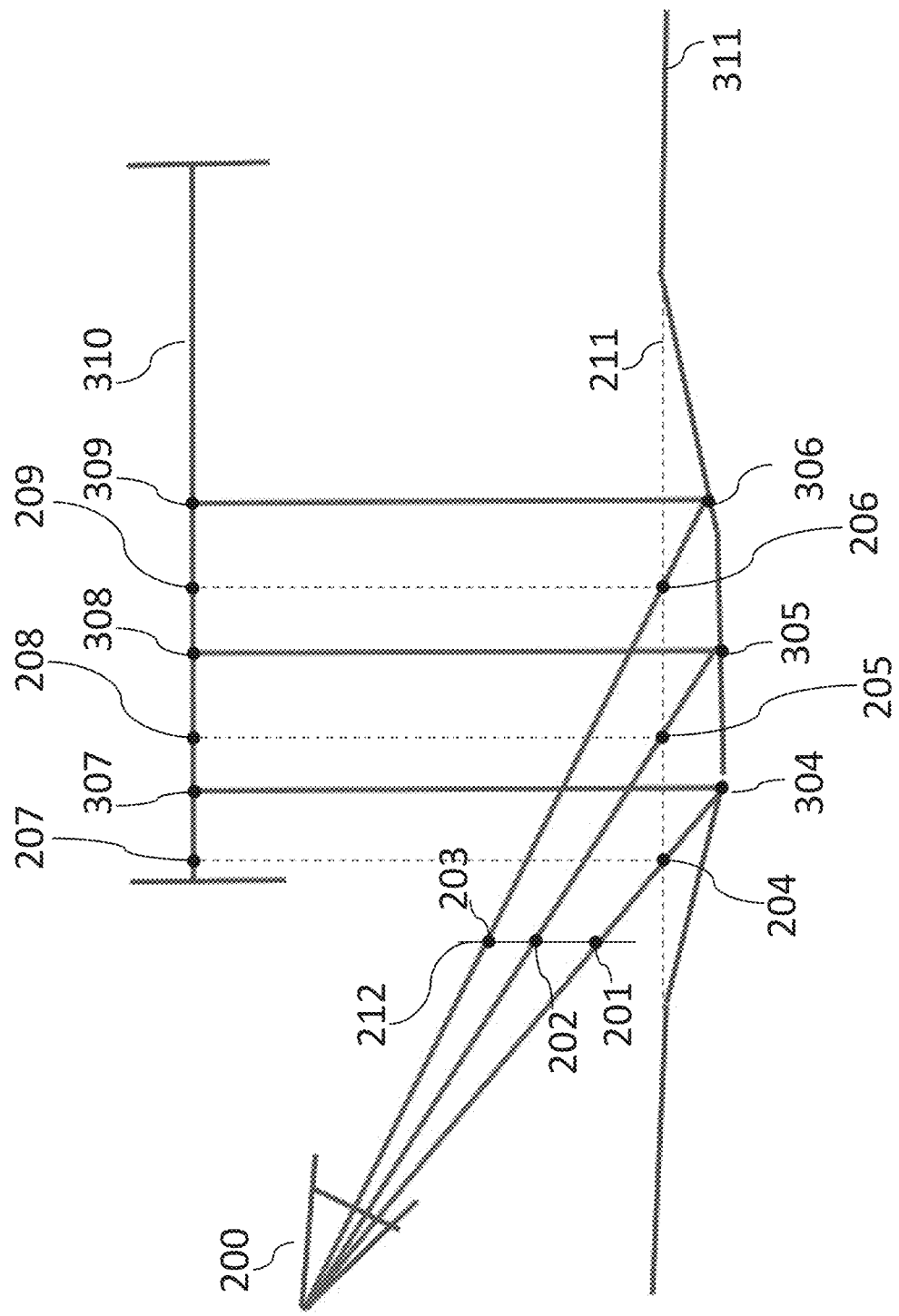
FIG. 4b illustrates a process of enhanced perspective mapping according to the present invention.

FIG. 4b illustrates a process of enhanced perspective mapping as utilized according to the present invention. In enhanced perspective mapping, ground 311 is not assumed planar, but may comprise height differences and slopes which are extracted from the lidar frames provided by a lidar frame provision device, e.g. a lidar sensor. Non-planar ground points 304, 305 and 306 on the ground 311 are perspectively projected onto the camera image 212 as points 201, 202 and 203, respectively. Meanwhile, in an ideal bird's eye view image, ground points 304, 305 and 306 are projected onto points 307, 308 and 309, respectively, this preserving the correct distances between ground points 304, 305, 306.

In comparison, if the non-planar ground 311 is erroneously assumed to be planar (cf. ground 211 shown as dotted line) the bird's eye view image resulting from conventional IPM would be distorted as real points 304, 305, 306 would be assumed to lie at points 204, 205, 206, respectively, which would be represented in the bird's eye view image as points 207, 208, 209, respectively, thus significantly diverting from points 307, 308 and 309 as representing the real situation on ground 311. Thus, enhanced IPM uses distance information in order to achieve the result illustrated in FIG. 4b.

Figure 4C:
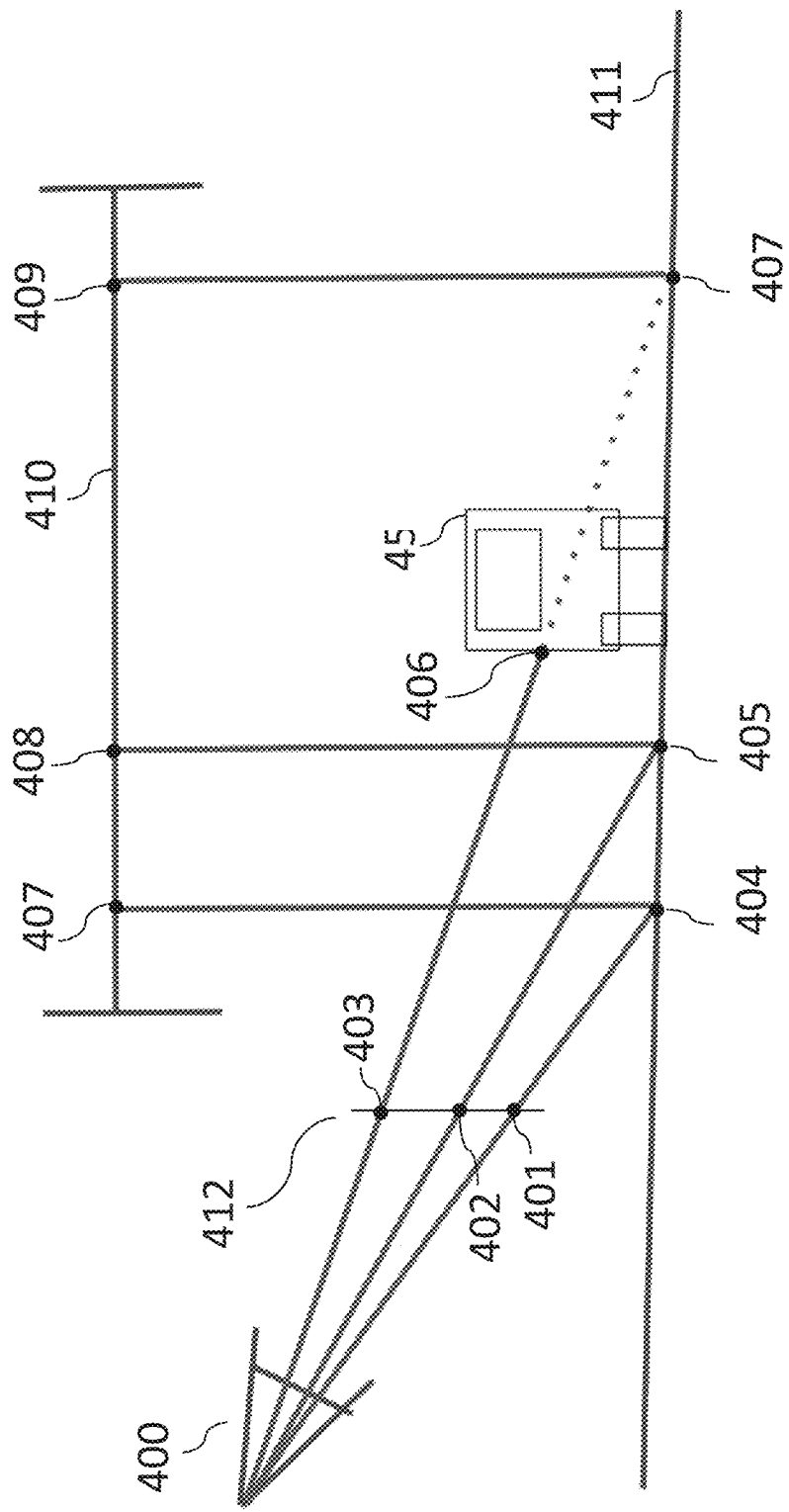
FIG. 4c illustrates another advantage of a process of enhanced perspective mapping according to the present invention.

FIG. 4c illustrates another aspect of enhanced perspective mapping according to the invention and how it prevents errors due to objects 450 occluding the ground 411. In analogy to FIGS. 4a, the ground 411 is assumed planar in FIG. 4c so that ground points 404, 405 captured by a camera image 412 as image points 401, 402 are read out, respectively, to determine color values of points 407, 408 of the bird's eye view image 410.

The camera image 412, inter alia, comprises a point 403 carrying the color value of non-ground point 406 of the occluding object 450. The invention prevents that image point 403 of camera image 412 is erroneously interpreted to correspond to ground point 407 and read out to determine the color value of point 409 of the bird's eye view image 410. Based on the mask image, enhanced IPM recognizes that image point 403 in fact relates to non-ground point 406 and discards this point in the bird's eye view image 410. The color value of point 409 of the bird's eye view image 411, corresponding to ground point 407, may be determined in the course of an ongoing process according to the invention, e.g. when generating the trajectory bird eye's view image, based on another camera image from a different angle or perspective.

The methods and apparatuses as described by way of the embodiments above allow to generate a bird's eye view image with a high accuracy by improving the ground estimation and without assumption a planar ground. This is, inter alia, achieved by utilizing the classifications of points in the segmented lidar frame and the mask image, both of which provide reliable information on the ground of the scene. An efficient solution is thus provided for generating a bird's eye view image with a high accuracy.

In the foregoing specification, the invention has been described with reference to specific embodiments thereof. It will, however, be evident that various modifications and changes may be made thereto without departing from the broader scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A computer-implemented method for generating a bird's eye view image of a scene, the method comprising the steps:
   (a) acquiring, by a lidar sensor, at least one lidar frame comprising points with inherent distance information and acquiring, by a camera, at least one camera image of the scene;
   (b) generating a mesh representation of the scene based on the at least one lidar frame, wherein the mesh representation represents surfaces shown in the scene with inherent distance information;
   (c) generating a mask image, wherein generating the mask image comprises:
      generating a segmented lidar frame, wherein generating the segmented lidar frame comprises classifying points of the at least one lidar frame as representing ground points or non-ground points of the scene based on the mesh representation; and
      mapping the segmented lidar frame to the at least one camera image to classify pixels of the at least one camera image as representing ground pixels or non-ground pixels of the at least one camera image; and
   (d) generating the bird's eye view image based on the mask image and the mesh representation, wherein generating the bird's eye view image comprises performing an inverse perspective mapping on the at least one camera image using the inherent distance information from the mesh representation, and wherein in the bird's eye view image non-ground objects are masked out based on the classification of pixels of the at least one camera image as representing ground pixels or non-ground pixels.

2. The method according to claim 1, wherein in step (c), classifying the pixels of the at least one camera image are as representing ground pixels or non-ground pixels of the at least one camera image comprises using a k-nearest neighbors algorithm, wherein the use of the k-nearest neighbors algorithm takes into consideration an established correspondence between each pixel in the at least one camera image and each point in the segmented lidar frame.

3. The method according to claim 2, wherein the k-nearest-neighbors algorithm uses k=3.

4. The method according to claim 1, wherein in step (c) classifying the points using the mesh representation comprises the following steps:
   calculating normal vectors and distances from points of the at least one lidar frame to the mesh representation; and
   classifying a point in the at least one lidar frame as a ground point based on the calculated distance of the point being within a predetermined distance and the calculated normal vector of the point being upwardly directed.

5. The method according to claim 4, wherein step (c) further comprises:
   classifying remaining unclassified points of the at least one lidar frame, wherein classifying the remaining unclassified points of the at least one lidar frame comprises the following steps:
      classifying a remaining point as a ground point based on a proportion of neighboring points classified as ground points exceeding a predetermined threshold, or based on a distance between the remaining point and other points classified as ground points being below a predetermined distance: or
      classifying still remaining unclassified points as non-ground based on the nearest point classified as a ground point exceeding a predetermined distance or there being a point classified as a ground point located below it.

6. The method according to claim 1, wherein in step (d) generating the bird's eye view image comprises the following steps:
   calculating real-world coordinates of the surfaces as represented by the mesh representation;
   projecting the real-world coordinates into an image space to generate pixels of the bird's eye view image, wherein projecting the real-world coordinates into the image space comprises transforming 3D coordinates into 2D pixels; and
   coloring pixels of the bird's eye view image by referring to the classified pixels in the mask image and colors of the corresponding pixels in the at least one camera image.

7. The method according to claim 1, further comprising the step:
   (e) generating a trajectory bird's eye view image by merging a plurality of bird's eye view images which correspond to camera images taken by the same camera from different positions.

8. The method according to claim 7, wherein merging the plurality of bird's eye view images comprises:
   for a respective pixel of the trajectory bird's eye view image, selecting, from among corresponding pixels of the plurality of bird's eye view images, a pixel having an estimated shortest projection distance to the camera as a representative pixel for the trajectory bird's eye view image.

9. The method according to claim 7, further comprising the step:
   (f) generating a final bird's eye view image by merging a plurality of trajectory bird's eye view images, wherein respective trajectory bird's eye view images of the plurality of trajectory bird's eye view images correspond to camera images taken by different cameras.

10. The method according to claim 9, wherein merging the plurality of trajectory bird's eye view images comprises equalizing mean and variance values of histograms of the trajectory bird's eye images.

11. The method according to claim 10, wherein the histograms are color histograms.

12. The method according to claim 9, wherein the plurality of bird's eye view images are merged such that the trajectory bird's eye view image is composed of those pixels of the plurality of bird's eye view images having an estimated shortest projection distance to the camera among corresponding pixels across the plurality of bird's eye view images; and wherein merging the plurality of trajectory bird's eye view images comprises the following steps:

calculating respective projection errors corresponding to respective pixels of the plurality of trajectory bird's eye view images, wherein a respective projection error corresponding to a respective pixel represents a pixel value difference between corresponding pixels of different bird's eye view images corresponding to camera images taken by the same camera; and composing the final bird's eye image using pixels of the plurality of trajectory bird's eye view images having the smallest projection error among corresponding pixels across the plurality of trajectory bird's eye view images.

13. A system for generating a bird's eye view image of a scene, the system comprising:

a lidar sensor configured to obtain at least one lidar frame comprising points with inherent distance information;

a camera configured to obtain at least one camera image of the scene; and a processor configured to:

generate a mesh representation of the scene based on the at least one lidar frame, wherein the mesh representation represents surfaces shown in the scene with inherent distance information;

generate a mask image, wherein generating the mask image comprises:

generating a segmented lidar frame, wherein generating the segmented lidar frame comprises classifying points of the at least one lidar frame as representing ground points or non-ground points of the scene based on the mesh representation; and mapping the segmented lidar frame to the at least one camera image to classify pixels of the at least one camera image as representing ground pixels or non-ground pixels of the at least one camera image by using the segmented lidar frame; and generate the bird's eye view image based on the mask image and the mesh representation, wherein generating the bird's eye view image comprises performing an inverse perspective mapping on the at least one camera image using the inherent distance information from the mesh representation, and wherein in the bird's eye view image non-ground objects are masked out based on the classification of pixels of the at least one camera image as representing ground pixels or non-ground pixels.

14. The system according to claim 13, wherein the processor is comprised in a test or simulation environment for testing autonomously driving vehicles or simulating traffic scenes and/or in a vehicle control system for autonomous driving and/or in a driver assistance system.

15. A non-transitory computer-readable medium having processor-executable instructions stored thereon for generating a bird's eye view image of a scene, wherein the processor-executable instructions, when executed, facilitate performance of the following steps:

(a) acquiring, by a lidar sensor, at least one lidar frame comprising points with inherent distance information and acquiring, by a camera, at least one camera image of the scene;

(b) generating a mesh representation of the scene based on the at least one lidar frame, wherein the mesh representation represents surfaces shown in the scene with inherent distance information;

(c) generating a mask image, wherein generating the mask image comprises:

generating a segmented lidar frame, wherein generating the segmented lidar frame comprises classifying points of the at least one lidar frame as representing ground points or non-ground points of the scene based on the mesh representation; and mapping the segmented lidar frame to the at least one camera image to classify pixels of the at least one camera image as representing ground pixels or non-ground pixels of the at least one camera image; and (d) generating the bird's eye view image based on the mask image and the mesh representation, wherein generating the bird's eye view image comprises performing an inverse perspective mapping on the at least one camera image using the inherent distance information from the mesh representation, and wherein in the bird's eye view image non-ground objects are masked out based on the classification of pixels of the at least one camera image as representing ground pixels or non-ground pixels.

* * * * *